United States Patent [19]

Nishino

[11] 3,984,724
[45] Oct. 5, 1976

[54] METHOD OF OPERATING A STORAGE TUBE

[75] Inventor: Tsutomu Nishino, Kawasaki, Japan

[73] Assignee: Matsushita Electric Industrial Co., Ltd., Japan

[22] Filed: Aug. 30, 1974

[21] Appl. No.: 502,189

[30] Foreign Application Priority Data

Nov. 5, 1973    Japan.................. 48-124799[U]

[52] U.S. Cl. ..................... 315/12 R; 315/13 ST
[51] Int. Cl.² .................... H01J 31/58; H01J 29/41
[58] Field of Search ..................... 315/12 R, 13 ST

[56] References Cited
UNITED STATES PATENTS

| | | |
|---|---|---|
| 2,687,492 | 8/1954 | Szegho et al.......................... 315/12 |
| 2,781,473 | 2/1957 | Covely et al. .................... 315/13 ST |
| 2,896,110 | 7/1959 | Hansen ................................ 315/12 |
| 3,748,585 | 7/1973 | Culter et al........................ 315/12 X |

Primary Examiner—Richard A. Farley
Attorney, Agent, or Firm—Robert E. Burns; Emmanuel J. Lobato; Bruce L. Adams

[57] ABSTRACT

An erasing process is accomplished by scanning a target with an unmodulated electron beam under the condition of secondary electron emission ratio of the target ($\delta$) above a unit value. Then a writing process is carried out by scanning the target with a modulated electron beam under the condition $\delta < 1$, and finally a reading process is achieved by scanning the target with an unmodulated electron beam also under the condition $\delta < 1$.

5 Claims, 13 Drawing Figures

ERASING MODE

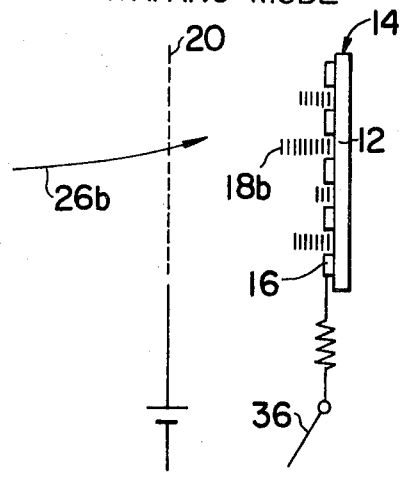
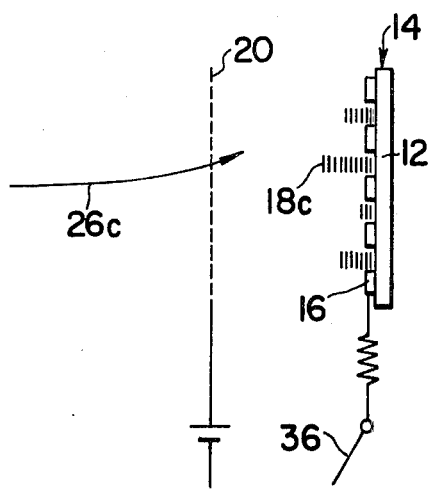
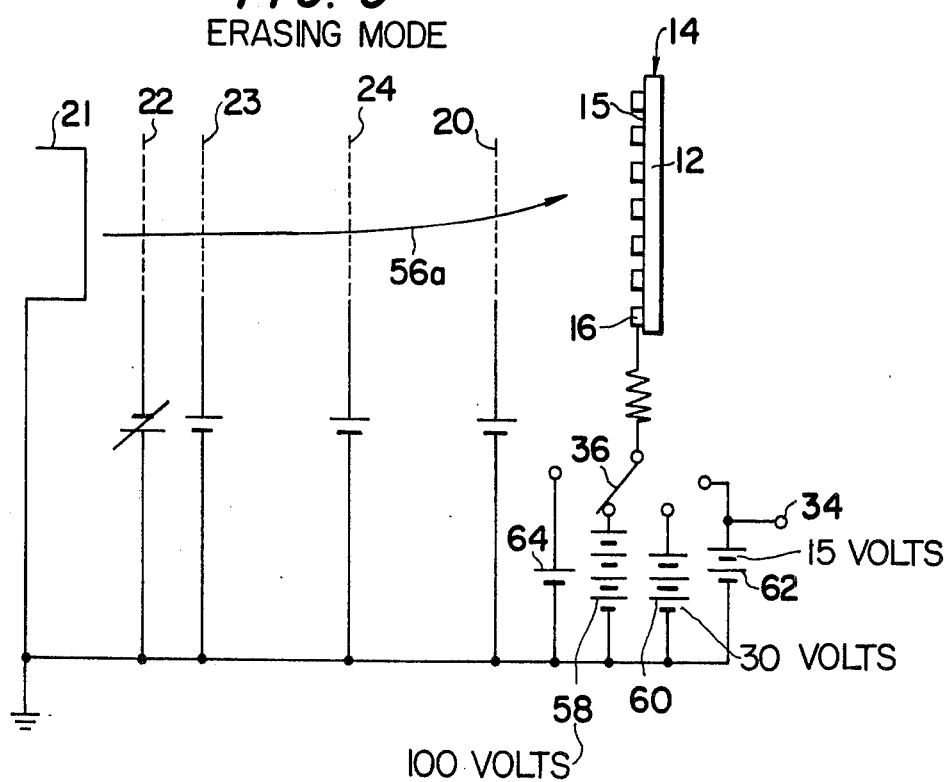

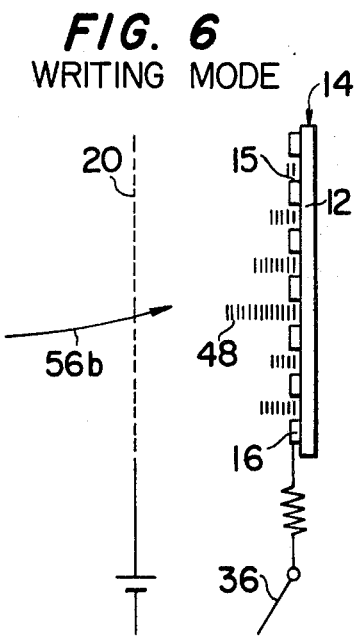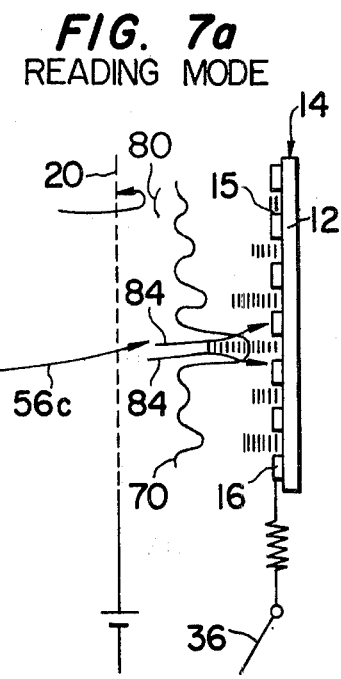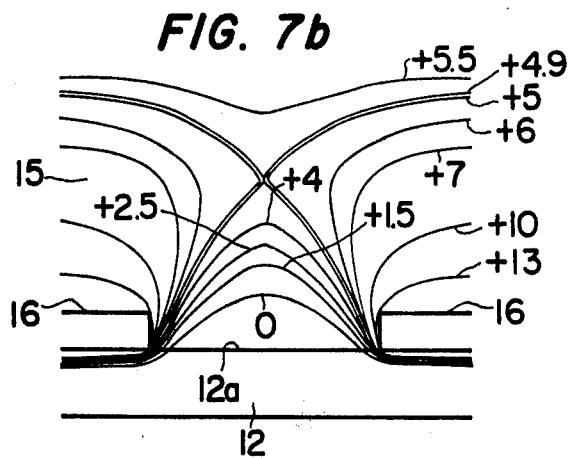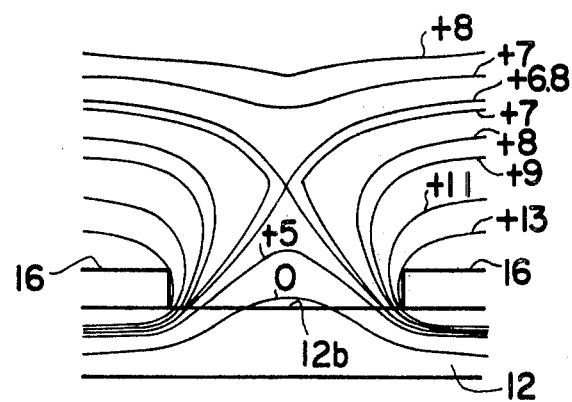

PREWRITING MODE

METHOD OF OPERATING A STORAGE TUBE

This invention relates generally to a method of operating a storage tube or a scan conversion tube for writing and reading a charge pattern on its target, and more particularly to a method of writing and reading a charge pattern on a target of an organic insulating material having mesh electrode thereon.

FIGS. 1–4 have been attached for perusal with the following description of prior art, wherein like parts in each of the figures are identified by the same reference characters, and thereafter how the disadvantages thereof will be overcome by the present invention will be described.

Reference is made to FIG. 1, wherein two curves A and B are illustrated to show variations of the secondary electron emission ratio ($\delta$) as a factor of the potential for different target materials employed. The curve A represent use of conventional target material such as inorganic materials of $C_aF_2$, $M_gF_2$ and $S_iO_2$, etc.

An erasing process will be described in connection with FIG. 2. The erasing process represents a deliberate removal of information retained in the form of electric charges on a target 14. In practice, the removal is accomplished by uniformly storing negative charges over a target surface 15. The target 14 consists of an insulating plate or film 12 and a mesh electrode 16 provided thereon in such a manner as to face an electron gun 21. The electron gun 21 emits an electron beam 26a to bombard the target surface 15. Reference numeral 20 designates a fourth grid or a field mesh which is set to a positive potential with respect to the cathode 21. Reference numerals 22, 23 and 24 designate first, second and third grids, respectively. The first grid is employed to accept an input signal and to modulate electron beams in a writing process illustrated below. The function of the second and third grids are not described for clarity since the present invention does not concerns them. In the erasing process, the mesh electrode 16 is connected to a d.c. power source 28 through a switch 36 and is set to an erasing potential, about 15 volts for example. It is to be understood that at such an erasing potential, $\delta$ of the target surface 15 is below a unit value, which is apparent from the curve A of FIG. 1. At such potential, the unmodulated electron beam 26a scans the target surface 15 thereby uniformly storing charges thereon as shown by reference numeral 18a, with the result that the previously stored charge pattern is erased and thus the target surface 15 is ready for the next writing process. In this case, the target surface 15 is charged to the −15 volt equilibrium potential. D.c. power sources 30 and 32 are employed in writing and reading processes respectively as will be mentioned below, and numeral 34 denotes an output terminal for deriving an output signal in the reading process.

The writing process is illustrated in FIG. 3, wherein the mesh electrode 16 is switched to the higher d.c. power source 30 in order to cause $\delta$ of the target 14 to advance above the unit value. Then the target 14 is scanned with the electron beam 26b modulated by an input pattern signal applied to the first grid 22. Therefore, on the target surface 15 a charge pattern 18b is formed corresponding to the pattern signal applied. In this case, an electron beam representing the white level is stronger than that of the gray or black levels so that the part of the target surface bombarded by the former electron beam emits more secondary electrons, thereby reducing the stored charges on the impinged upon part more than those impinged upon in the latter parts. In other words, the writing is accomplished by subtracting charges from the target surface 15 in a pattern corresponding to the input signal. In this connection, it is to be noted that the maximum amount of charges on the target surface 15 does not exceed the previously uniformly stored charges.

Finally, the reading process in accordance with the prior art is illustrated in FIG. 4, wherein the mesh electrode 16 is switched to the other d.c. power source 32 to cause the $\delta$ of the target 14 to reduce below the unit value. In this case, the potential of the d.c. power source 32 is less than 5 volts, for example. Thereafter, the unmodulated electron beam 26c scans the target 14 on which a desired charge pattern has been formed in the writing process. In this case, some of the electron beam reaching near the target surface 15 is repelled by the charges stored thereon in proportion to the amount of the stored charges and the electrons are then collected by the fourth grid 20. Consequently, the intensity of the electron beam entering the target 14 is inversely proportional to that of the stored charges. Therefore, it is understood that parts of the target surface 15 representing the white level receive more electrons than the other parts representing the black or gray levels.

In the above described conventional system, several disadvantages are encountered. That is, first in the writing process the potential of the target 14 must be shifted to increase $\delta$ above the unit value as mentioned above, or otherwise the target potential must be elevated to within the range of 100 to several thousand volts in order to bring the target 14 to about the second crossover point thereof. At such a high target voltage, a voltage variation of the d.c. power source invites an undesirable variation in the amount of charges to be stored, resulting in decreasing a signal to noise ratio of a reproduced picture. To avoid this shortcoming it is necessary to reduce the voltage variation of the d.c. power source, however, it is very difficult to reduce such a variation to a desirable extent when using the high voltage as mentioned above.

A second defect is that the target surface 15 might be damaged in the writing process due to an intense electron beam bombardment or partially large $\delta$ on the target surface 15. This undesirable phenomenon results from the following reasons: As previously mentioned, the writing process is carried out by emitting secondary electrons from the target 14 on which negative charges have been uniformly stored. Therefore, the intense electron beam representing the white level or the partially high $\delta$ of the target surface 15 emit many more secondary electrons, resulting in removing entirely the negative charges on the part bombarded by the intense beam or on the part having the high $\delta$, and also resulting in establishing positive charges thereon. Thus, the target surface 15 is damaged or changed in quality to invite abnormal behavior. Furthermore, the target 14 might be partially burned to suffer irreversible damage. Even if such damages to the target 14 are avoided, it takes a considerable length of time to restore a normal condition.

Finally, a third defect is pointed out as follows: In the reading process, the target potential must be maintained at less than about 5 volts because a higher potential reduces a contrast of a reproduced picture. This contrast reduction results from the fact that electrons begin to deposit in the deepest valleys of the charge pattern 18c as the target potential increases above 5 volts. For the above reason, in the prior art the target potential is limited to below 5 volts. However, due to such a low potential, certain shortcomings are encountered. That is, the low potential may cause "shading" in the periphery of a reproduced picture since incident angles of the electron beams on the target 14 differ in the central and peripheral portions thereof. Furthermore, it is very difficult to obtain constant characteristics of electrons landing on the target 14 since at such a low potential it is not easy to limit voltage variations to within the order of about 0.1 volt.

It is therefore a primary object of the present invention to provide an improved method of operating a storage tube or a scan conversion tube for writing and reading a charge pattern on its target which overcomes the shortcomings of the prior art mentioned hereinabove.

Another object of the present invention is to provide an improved target using an organic film made of polyimides or copolymer of amides and imides.

Still another object of the present invention is to provide an improved method of obtaining a charge retaining pattern on a target of a scan conversion tube for a desired time by employing a feedback technique.

These and other objects, features and many of the attendant advantages of this invention will be appreciated more readily as the invention becomes better understood by the following detailed description, when considered in connection with the accompanying drawings, wherein like parts in each of the several figures are identified by the same reference characters, and wherein:

FIG. 3 shows a part of the FIG. 2 arrangement for illustrating a writing process according to a prior art;

FIG. 4 shows a part of the FIG. 2 arrangement for illustrating a reading process according to a prior art;

FIG. 5 shows a schematic arrangement of a charge storage tube for illustrating an erasing process according to the present invention;

FIG. 6 is a part of the FIG. 5 arrangement illustrating a writing process according to the present invention;

FIG. 7a is a part of the FIG. 5 arrangement illustrating a reading process according to the present invention;

FIG. 7b shows electric equipotential lines in the vicinity of a part of a target surface in a reading process according to the present invention;

FIG. 7c shows different electric equipotential lines in the vicinity of a part of a target surface in a reading process according to the present invention;

Figure 1:
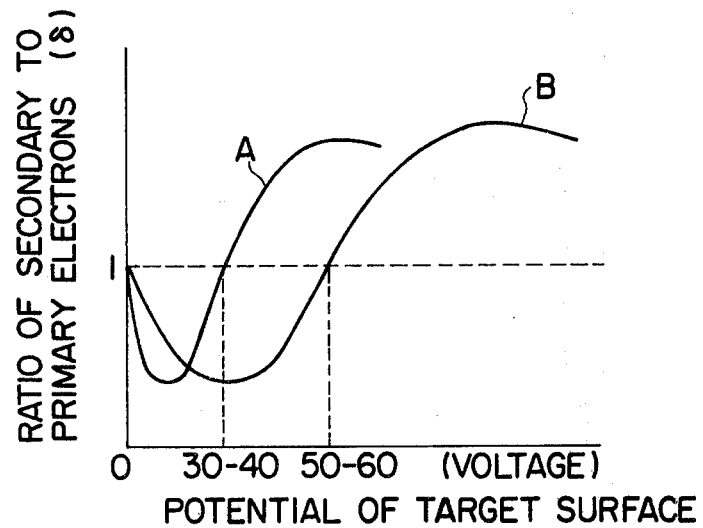
FIG. 1 is a graph showing variations of secondary electron emission ratios as a factor of potential for different target materials.
Figure 2:
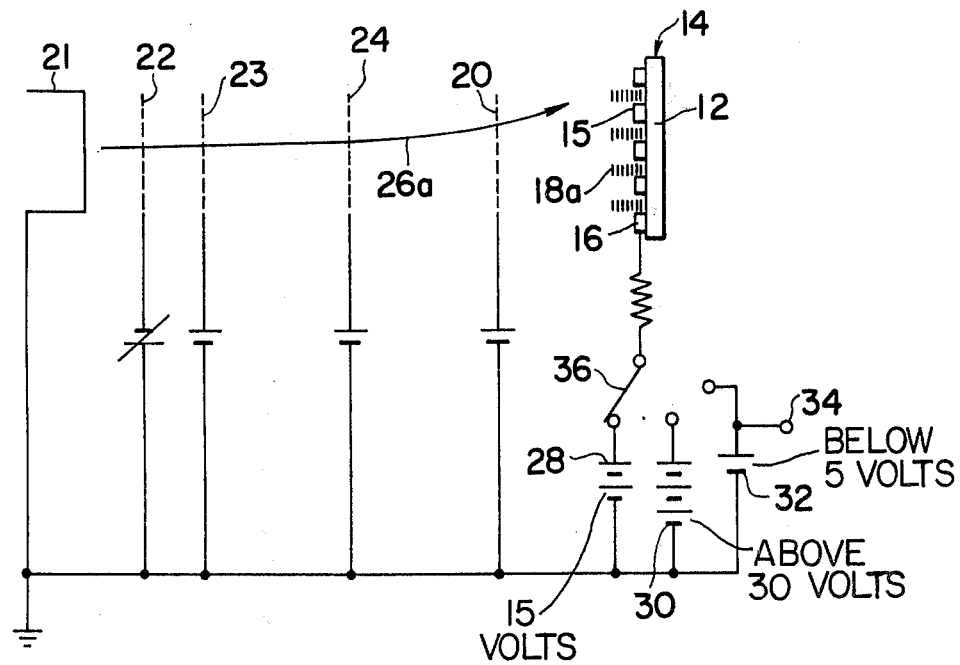
FIG. 2 shows a schematic arrangement of a charge storage tube for illustrating an erasing process according to a prior art.

Reference is made to FIG. 1, wherein the curve B illustrates a ratio of secondary to primary electrons ($\delta$) as a factor or potential when an organic compound film made of polyimides or a copolymer of amides and imides is used. The use of such an organic compound film is one of the features of the present invention. As seen from the curve B, $\delta$ exceeds the unity value above the 50–60 volt range. In this case, it should be noted that the present invention is not restricted to the above mentioned organic compound film, but is applicable if a first cross-over potential of a material is above about 50 volts.

In FIG. 5, the mesh electrode 16 is seen connected through switch 36 to a d.c. power source 58 and set to a potential higher than 60 volts, for example 100 volts, and then the target 14 is scanned by an unmodulated electron beam 56a. Since the target 14 is bombarded under the condition $\delta > 1$, previously stored charges on the target surface 15 are ejected therefrom and collected by the fourth grid or the field mesh 20. In the writing process, the following additional step is preferred in order to obtain a well reproduced picture having a high signal-to-noise ratio, for example. That is, the field mesh 20 potential is made equal to the potential of the mesh electrode 16, namely, 100 volts while the target surface 15 is scanned by the unmodulated electron beam 56a. By this step, a priming or prewriting processes required in the prior art are omitted.

A writing process according to the present invention is illustrated in FIG. 6 of the drawings. The purpose of the writing is to establish a desired charge pattern 48 on the target 14. The mesh electrode 16 is switched to a d.c. power source 60 of FIG. 5 and is set between 20 and 50 volts, at which potential it is understood from the curve B of FIG. 1 that $\delta$ is below a unit value. Thereafter, the target surface 15 is scanned by an electron beam 56b which is modulated with an input pattern signal applied to the first grid 22 of FIG. 5, resulting in accumulating charges on the target surface 15 in a desired pattern corresponding to the input signal. The amount of the charges thus stored is proportional to the intensity of the electron beam bombarding the target 14. Since the electron beam corresponding to the signal of the white level is the most intense one, the amount of stored charges based on it are greatest. On the contrary, the electron beam corresponding to a signal of the black level serves to accumulate least charges. It is to be noted that the greatest amount of the stored charges depends on the potential of the target 14. If some of the target surface 15 are sufficiently bombarded by the most intense electron beam, namely, the beam representing the intensity of the white level signal, the parts are charged up to the cathode potential. For instance, assuming that the target voltage is 30 volts, the parts in question are able to store maximum charges corresponding to −30 volts and became equal to the cathode potential.

A reading process according to the present invention will be described with reference to FIG. 7a. As shown the mesh electrode 16 is switched to a d.c. power source 62 of FIG. 5 and to have a reading potential of, for example, 15 volts. It is to be noted that the reading potential must be set between 10 and the writing potential. Thereafter, the target surface 15 is scanned by an unmodulated electron beam 56c, resulting in uniformly accumulating charges thereon corresponding to the reverse potential of the reading one. That is, if the reading potential is 15 volts, then the stored charge corresponds to −15 volts. In this case, since the reading potential is lower than the writing one, the charge pattern 48 in FIG. 6 is not erased by the uniformly stored charges and does not adversely affect the contrast of a reproduced picture. The charge thus stored uniformly can suppress unwanted noises due to partially different δ values on the target surface 15, uneven surfaces thereof, flaws thereon, or defect of the mesh electrode, etc.

As shown in FIG. 7a, an electric potential line 70 is formed above the target surface 15, which line depends on the potential difference between the stored negative charges and the mesh electrode 16. Variation of the potential line 70 above the target surface 15 is inversely proportional to the amount of the stored charges. Under such a situation, when an unmodulated electron beam 56c scans the target surface 15, the electrons of the beam 56c are attracted toward the mesh electrode 16 in the direction perpendicular to the potential line 70 due to the electric field established. It is understood that the intensity of the attraction is proportional to the depth of the valley of the potential line 70. Therefore, electrons of the beam 56c near a part 80 are not so strongly attracted toward the mesh electrode 16 so that some of the electrons are collected by the fourth grid 20. On the other hand, an electron beam 84 of electrons travelling toward many more charged parts are intensely attracted due to the intense electric field established whereby many more electrons enter the target surface 15. As a result, the electron beam 56c electrons enter the mesh electrode 16 in proportion to the amount of the stored charges. In this case, the electron beam electrons entering the mesh electrode 16 emit secondary electrons therefrom. However, these emitted electrons are repelled by the negative potential established by the space charges on the insulating material or film 12 thereby returning them back to the mesh electrode 16. Therefore, most of the electrons entering the target 14 are derived as an output signal from the output terminal 34. From the above, it is understood that the derived output signal is proportional to the amount of the charges on the target 14. The above mentioned phenomenon of drawing electrons into the mesh electrode 16 is realized only when the mesh electrode potential is above 10 volts. If it is under 10 volts, as in prior art previously described, electrons are repelled by the charges stored on the target 14 so that the output current thus obtained is inversely proportional to the amount of the stored charges.

In FIGS. 7b and 7c, there are shown in detail electric equipotential lines in the vicinity of a part of the target surface 15, which have been determined by employing an electrolytic tank. From these drawings, it can be understood more clearly that the electron beam electrons enter the mesh electrode 16 in proportion to the amount of the stored charges as described in connection with FIG. 7a. In FIGS. 7b and 7c, the stored charges on the parts 12a and 12b of the insulating organic film 12 are assumed to equal −30 and −15 volts, respectively. It is apparent that the zero potential line of FIG. 7b projects toward the electron gun 21 shown in FIG. 5 more than in FIG. 7c. Therefore, it is concluded that the electrons travelling toward part 12a in FIG. 7b are liable to enter the mesh electrode 16 to a greater extent than the electrons travelling toward part 12b in FIG. 7c, because the electrons are repelled by the zero potential line and then travel in the direction perpendicular to the equipotential lines.

Figure 7D:
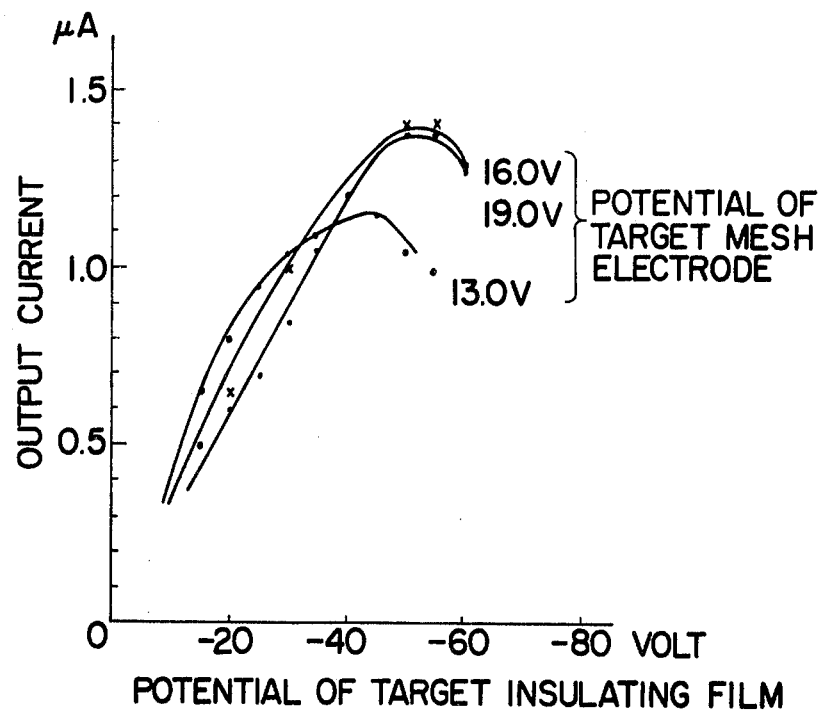
FIG. 7d is a graph illustrating a relationship between an output current and a potential on an insulating film of a target for different potentials of a mesh electrode of the target.

FIG. 7d shows a relationship between the output current and the potential of the surface of the insulating film 12 at different potentials applied to the mesh electrode 16. As seen from the output characteristics according to the present reading process, provided that the variation of the potential of the mesh electrode 16 is especially between 16 and 19 volts, the output current is not adversely affected by that of the potential of the mesh electrode 16. Therefore, the third defect of the prior art is completely avoided in that the output current varies with very little fluctuation of the mesh electrode potential.

Figure 8:
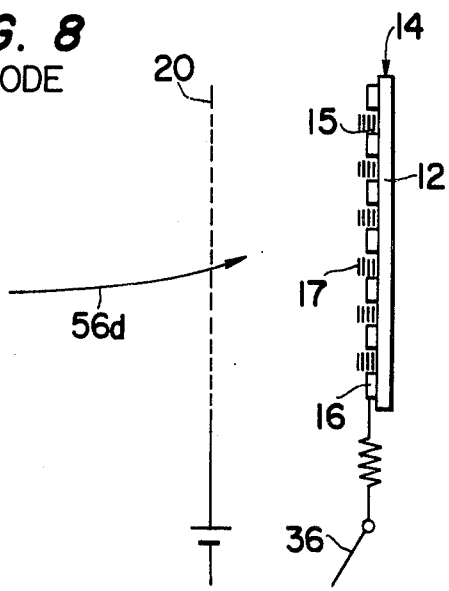
FIG. 8 is a part of the FIG. 5 arrangement illustrating an additional process prior to a writing process according to the present invention.

FIG. 8 illustrates a modified prewriting process according to the present invention. The purpose of this process is to increase a signal-to-noise ratio of a reproduced picture. If the writing process of FIG. 6 is carried out immediately after the FIG. 5 erasing process, a charge pattern involving undesirable noise signals will be formed on the target 14 due to random landing of beam electrons having large initial velocities. To avoid the defects and increase the signal-to-noise ratio, prior to the writing process of FIG. 6 the mesh electrode 16 is switched to a d.c. power source 64 of FIG. 5 for setting it between 3 and 7 volts. Thereafter, an unmodulated electron beam 56d scans the target surface 15 to uniformly store charges thereon. These uniformly stored charges serve to repel the beam electrons with high energy so that the background of a reproduced picture is not deteriorated and neither is the noise-to-signal ratio reduced.

The method of operation of writing and reading a charge pattern on the target 14 in connection with the single-gun storage tube has been described. However, the above mentioned method of operation can be employed with a two-gun type storage or scan converter tubes as shown in FIG. 9, wherein the mesh electrode 16 is incorporated in facing relationship with a reading gun 124 and the other side thereof facing a writing and erasing gun 104.

Figure 9:
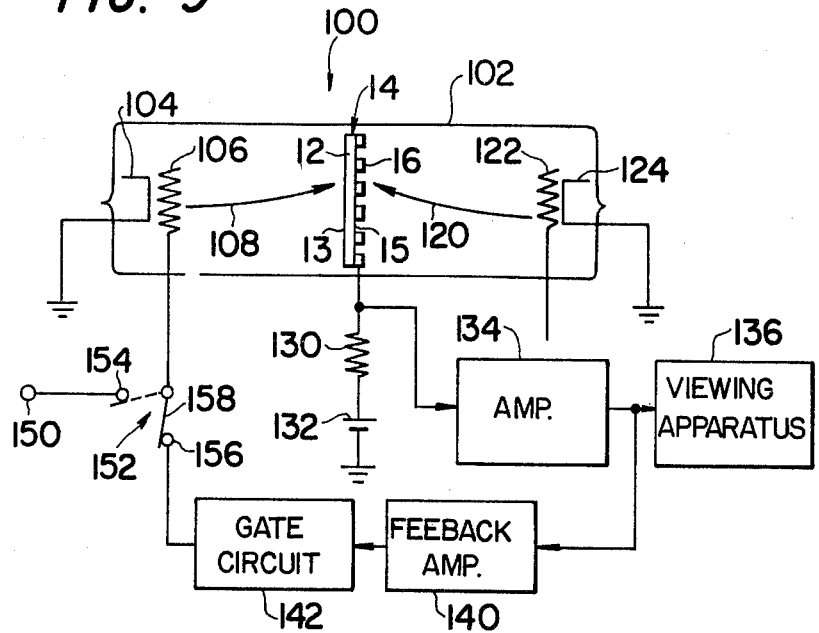
FIG. 9 is a schematic block diagram of a two-gun type of a storage or scan conversion tube, which shows another improved method of operation according to the present invention.

In FIG. 9, there is illustrated another improved method of operation according to the present invention, by which method a charge pattern can be retained on the target 14 for a desired time. A charge pattern formed on the target 14 when left alone will dissipate in several minutes or at most 30 minutes. This is because electrons on the target 14 leak therefrom due to low conductivity of the insulating plate or film 12 and also because the electrons on the target 14 are neutralized by positive ions of residual gas within an envelope 102. In the FIG. 9 embodiment, the dissipation of the charge pattern is avoided by employing an improved feedback technique based on the fact that writing and a reading processes are carried out at the same time in a type of a two-gun storage tube. As shown, within the envelope 102 of a two-gun storage tube 100 a writing gun 104 and a reading electron gun 124 are provided at the opposite ends thereof and between them the target 14 is incorporated such that the mesh electrode 16 faces the reading gun 124. In operation, a moving arm 158 of a switch 152 is switched to a contact 154 in order that an input signal is applied to a grid 106 from an input terminal 150. The signal thus applied modulates an electron beam 108 emitting from the writing gun 104. The electron beam 108 scans the back surface 13 of the target 14 thereby to begin to store a charge pattern on the target surface 15 corresponding to the applied signal from the input terminal 150. At the same time, an electron beam 120 emitted from the reading gun 124 starts to scan the target surface 15, so that an output current is derived from the mesh electrode 16 and across a load resistance 130 a voltage variation due to the derived output current is developed. As shown, the mesh electrode 16 is connected through the load resistance 130 to a positive terminal of a d.c. power source 132 for being supplied with a suitable potential. The voltage variation developed across the load resistance 130 is fed to an amplifier 134 to be amplified thereby to a predetermined value and then applied to a suitable viewing apparatus 136. Immediately after the writing process is finished, the moving arm 158 is switched to a contact point 156. As a consequence, the amplified output from the amplifier 134 is fed back to the grid 12 through a feedback amplifier 140, a gate circuit 142 and the switch 152. In this way, the feedback operation compensates for escaped charges from a charge pattern stored on the target 14 thereby to retain it thereon as long as the feedback operation continues. If the moving arm 158 is disconnected from the contact 156, the charge pattern on the target 14 will dissipate in a few minutes.

In the feedback operation described above, provided that the feedback signal is too strong, contrast of a reproduced picture is reduced or the charge pattern on the target 14 would be undesirably removed. On the contrary, if the output from the amplifier 134 is sufficiently fed back, escape of the electrons charge pattern continues to finally dissipate the charge pattern. To avoid this disadvantages, the feedback value is determined as follows.

Figure 10:
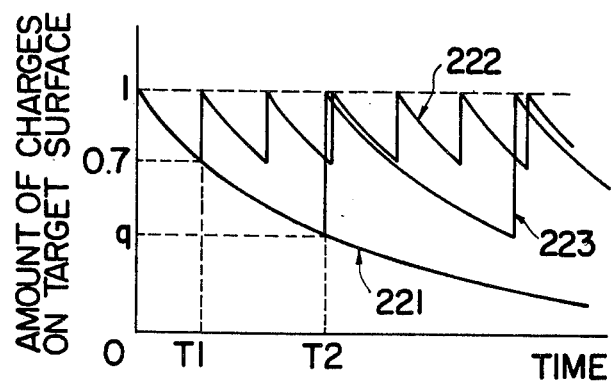
FIG. 10 is a graph illustrating variations of the amount of charges on the FIG. 9 embodiment target surface as a function of time.

In FIG. 10, three kinds of variations of the amount of the charges on the target 14 as a factor of time are shown. As previously mentioned, the amount of the charges will decrease continuously with a lapse of time as shown by a curve 221 due to low conductivity of the insulating plate or film 12, etc. Therefore, if the decreased amount of charges is periodically properly compensated by suitable means, the charge pattern can be retained on the target 14. A curve 222 represents a relationship of the variation of the amount of charges vs time where the compensating operation takes places at T1 when the amount of charges decreases to 70 percent of the initial value. In this case, to restore to the initial value, the amount of charges corresponding to 30 percent of the initial value must be compensated. To this end, the gain of amplification of the feedback amplifier 140 (FIG. 9) should be set to 0.43 which is determined as follows:

$$\frac{30 \text{ (the amount of escaped charges in \%)}}{70 \text{ (the amount of charges derived from the tube 100 in \%)}} = 0.43$$

As a consequence, the amount of charges on the target 14 is periodically restored to the original at every interval of T1. A curve 223 represents a relationship of the variation of the amount of charges vs. time where the compensating operation takes places at T2 when the amount of charges decrease to $q$ percent of the initial value. Therefore in general, in order that the amount of the escaped charges is restored to the initial value, the gain of the feedback amplifier 140 must be set at $(1-q)/q$, which is apparent from the description of the curve 222.

From the foregoing, it is understood that the FIG. 9 embodiment has an important feature of retaining a charge pattern on the target 14 for a desired time.

What is claimed is:

1. A method of operating a storage tube for writing and reading a charge pattern on a target of the tube, wherein the target is of the type including a mesh electrode on a face thereof and which exhibits a secondary electron to primary electron emission ratio greater than unity when a potential of the mesh electrode exceeds about 50 volts, which method comprises the following steps in the sequence set forth:

scanning the target face with an unmodulated electron erasing beam while simultaneously biasing the mesh electrode with an erasing potential exceeding about 60 volts and sufficient to bias the target to exhibit a secondary electron to primary electron emission ratio greater than unity, whereby secondary electrons emitted by the target dissipate any residual charge on the target face to effect erasure thereof;

scanning the target face with an intensity modulated electron writing beam while simultaneously biasing the mesh electrode with a writing potential between about 20 volts to about 50 volts to maintain the secondary electron to primary electron ratio less than unity, thereby to store on the target face a surface charge pattern determined by the scanning and the modulation of said writing beam; and scanning the target face having the charge pattern stored thereon with an unmodulated electron reading beam while simultaneously biasing the mesh electrode with a reading potential between about 10 volts and a potential less than the writing potential, thereby to develop a mesh electrode current which is proportional to the charge stored on the target face at each portion of the target face scanned by the reading beam.

2. A method of operating a storage tube as claimed in claim 1, wherein said target is made of a substance selected from the group consisting of polyimides and copolymers of amides and imides.

3. A method of operating a storage tube as claimed in claim 1, wherein the potential of a field mesh incorporated adjacent said target is equal to the potential of said target in said erasing.

4. A method of operating a storage tube as claimed in claim 1, which further comprises, after said scanning with the erasing beam, the step of scanning said target with an unmodulated electron beam with the mesh electrode simultaneously biased to effect a secondary electron to primary electron emission ratio of said target less than unity to uniformly store charges on said target.

5. A method of operating a storage tube as claimed in claim 4, wherein the potential of said target in said scanning is between 3 and 7 volts.

* * * * *